United States Patent
Ogashiwa et al.

(10) Patent No.: US 7,789,287 B2
(45) Date of Patent: Sep. 7, 2010

(54) METHOD OF BONDING

(75) Inventors: Toshinori Ogashiwa, Hiratsuka (JP);
Masayuki Miyairi, Hiratsuka (JP)

(73) Assignee: Tanaka Kikinzoku Kogyo K.K., Tokyo (JP)

( * ) Notice: Subject to any disclaimer, the term of this patent is extended or adjusted under 35 U.S.C. 154(b) by 162 days.

(21) Appl. No.: 12/063,264

(22) PCT Filed: Jun. 4, 2007

(86) PCT No.: PCT/JP2007/061266
§ 371 (c)(1),
(2), (4) Date: Feb. 8, 2008

(87) PCT Pub. No.: WO2007/142175
PCT Pub. Date: Dec. 13, 2007

(65) Prior Publication Data
US 2009/0230172 A1  Sep. 17, 2009

(30) Foreign Application Priority Data
Jun. 5, 2006  (JP) .............................. 2006-156085

(51) Int. Cl.
*B23K 20/00* (2006.01)
*B23K 20/02* (2006.01)
*B22F 3/00* (2006.01)

(52) U.S. Cl. .................. 228/110.1; 228/111; 228/120; 75/313; 75/356; 75/757

(58) Field of Classification Search ............. 228/110.1, 228/111, 120; 75/313, 356, 757
See application file for complete search history.

(56) References Cited

U.S. PATENT DOCUMENTS 3,950,166 A * 4/1976 Obara et al. .................. 419/33

(Continued)

FOREIGN PATENT DOCUMENTS

JP  9-326416  12/1997

(Continued)

OTHER PUBLICATIONS

English Translation Hiroshi et al. (JP 2006-054212).*

(Continued)

*Primary Examiner*—Jessica L Ward
*Assistant Examiner*—Erin B Saad
(74) *Attorney, Agent, or Firm*—Roberts & Roberts, LLP

(57) ABSTRACT

The present invention provides a bonding method in which a bonded portion having a sufficient bonding strength can be obtained at a relatively low temperature, for example, in die bonding a semiconductor chip. A metal paste 20 was applied to a semiconductor chip 10, the metal paste 20 consisting of metal powder of one or more kinds selected from gold powder, silver powder, platinum powder, and palladium powder having a purity not lower than 99.9 wt % and an average particle diameter of 0.005 μm to 1.0 μm and an organic solvent. After being applied, the metal paste 20 was dried in a vacuum in a dryer. The chip was heated at 230° C. for 30 minutes to sinter the metal paste, by which a metal powder sintered compact 21 was formed. Next, a nickel plate 30 was placed on the semiconductor chip 10, and bonded to the semiconductor chip 10 by heating and pressurization.

18 Claims, 4 Drawing Sheets

U.S. PATENT DOCUMENTS

2003/0127747 A1* 7/2003 Kajiwara et al. ............ 257/778
2004/0262753 A1* 12/2004 Kashiwazaki ............... 257/734
2008/0146016 A1* 6/2008 Schwirtlich et al. ......... 438/618
2009/0146117 A1* 6/2009 Suenaga et al. ........... 252/520.3

FOREIGN PATENT DOCUMENTS

| JP | 2004-006521 | 1/2004 |
| JP | 2006-054212 | 2/2006 |
| WO | WO 2006057348 A1 * | 6/2006 |

OTHER PUBLICATIONS

English Translation Naoya et al. (JP09-326416).*

* cited by examiner (a) Example 1  (b) Example 2

Pressurization + Heating    Pressurization + Heating + Ultrasonic wave S

| | Appearance (Side surface) | Cross section (Center) |
|---|---|---|
| Metal powder Sintered compact |  |  |
| Example 1 (Heating+Pressurization) |  |  |
| Example 2 (Heating+Pressurization +Ultrasonic waves) |  |  |

METHOD OF BONDING

TECHNICAL FIELD

The present invention relates to a method for bonding a pair of bonded members at a relatively low temperature. More particularly, it relates to a method for performing die bonding or flip chip bonding of a chip to a substrate at a low temperature.

BACKGROUND ART

A brazing method using a brazing filler metal has been used widely as a method for bonding various members. In particular, in order to conduct die bonding of a semiconductor chip used for a high-frequency optical module etc. to a substrate, a fluxless brazing filler metal is used to prevent contamination of parts. As such a brazing filler metal, AuSn-based brazing filler metals are generally used (for example, Patent Document 1).

Patent Document 1: Japanese Patent Laid-Open No. 2004-006521

Usually, in the brazing method using a brazing filler metal, after the brazing filler metal has been fused to one bonded member (for example, a semiconductor chip), the one bonded member is placed on the other bonded member (for example, a substrate), and the brazing filler metal is melted by heating to a temperature not lower than the melting point of brazing filler metal and is solidified. The temperature at the bonding time is often set at a temperature higher than 300° C. considering the melting point of the brazing filler metal used (the melting point of AuSn-based brazing filler metal is about 280° C.).

DISCLOSURE OF THE INVENTION

Problems to be Solved by the Invention

However, if the bonding temperature is made high, a thermal stress produced when the bonded members are cooled to the ordinary temperature S after bonding increases, and the influence thereof on the bonded member is feared. For example, in the die bonding of semiconductor chip, fluctuations in electrical properties of the semiconductor chip may occur due to the thermal stress. Therefore, depending on the bonded member, a method in which the bonding temperature is as low as possible is desired to reduce the thermal stress. The present invention has been made in the above-described circumstances, and accordingly an object thereof is to provide a bonding method having a sufficient bonding strength at a relatively low temperature. Concretely, an object of the present invention is to provide a bonding method in which bonding can be performed even at a temperature not higher than 300° C.

Means for Solving the Problems

To solve the above-described problems, the inventors conducted studies of bonding methods replacing the conventional brazing method. As the result of the studies, a bonding method using a metal paste having a predetermined composition was found.

The present invention provides a method for bonding a pair of bonded members, which is characterized by including the following steps.

(a) A step of applying a metal paste to one bonded member, the metal paste consisting of metal powder of one or more kinds selected from gold powder, silver powder, platinum powder, and palladium powder having a purity not lower than 99.9 wt % and an average particle diameter of 0.005 µm to 1.0 µm and an organic solvent.

(b) A step of drying the metal paste and sintering the dried metal paste at a temperature of 80 to 300° C. to form a metal powder sintered compact.

(c) A step of arranging the one bonded member and the other bonded member via the metal powder sintered compact and bonding the bonded members to each other by applying pressure from one direction or both directions while at least the metal powder sintered compact is heated.

The bonding method in accordance with the present invention is a bonding method in which a metal paste in place of a brazing filling metal is used. In this method, pressure is applied while the metal paste applied to the bonded member is heated, by which the metal powders in the paste are combined while being plastically deformed to form a dense bonding portion, and thereby bonding is performed. To easily promote the combination of metal powders in the bonding step, the paste is sintered to form the metal powder sintered compact before pressurization. Hereunder, the method in accordance with the present invention is explained in more detail.

As the metal paste to be used in the present invention, a metal paste that is obtained by mixing an organic solvent with metal powder of one or more kinds selected from gold powder, silver powder, platinum powder, and palladium powder having a purity not lower than 99.9 wt % and an average particle diameter of 0.005 µm to 1.0 µm is used. The reason why the metal powder is required to have a high purity not lower than 99.9 wt % is that a low purity increases the hardness of powder, which makes plastic deformation difficult. Also, the metal powder having an average particle diameter exceeding 1.0 µm has difficulty in forming a favorable proximity state at the time of sintering, described later. On the other hand, the metal powder having an average particle diameter smaller than 0.005 µm aggregates easily and is difficult to handle when a paste is formed. The reason why the metal powder consists of any of gold powder, silver powder, platinum powder, or palladium powder is that in the case where the metal paste is used in bonding a semiconductor chip, for example, in die bonding, the metal paste is required to have electric conductivity, and these metals have a high electric conductivity.

As the organic solvent constituting the metal paste, ester alcohol, turpineol, pine oil, butyl carbitol acetate, butyl carbitol, and carbitol are preferable. For example, as a preferable ester alcohol based organic solvent, 2,2,4-trimethyl-3-hydroxypentaisobutylate ($C_{12}H_{24}O_3$) can be cited. These solvents are preferable because they can be dried at a relatively low temperature.

The metal paste may contain a resin of one or more kinds selected from acrylic resin, cellulosic resin, and alkyd resin. Further addition of these resins makes the metal paste more homogeneous because the aggregation of metal powder in the metal paste is prevented. As the acrylic resin, methyl methacrylate polymer can be cited. As the cellulosic resin, ethyl cellulose can be cited. As the alkyd resin, phthalic anhydride resin can be cited. Among these, ethyl cellulose is especially preferable.

As a method for applying the metal paste to the bonded member, the spin coat method, screen printing method, ink jet method, a method in which paste is spread by using a spatula etc. after being dripped, and other various methods can be used in accordance with the size of bonding portion.

The applied metal paste is dried to remove the organic solvent in the paste. The drying is performed preferably at a temperature not lower than −20° C. and not higher than 5° C. The atmosphere in the drying step may be a decompressed atmosphere. In this case, the moisture in the air can be prevented from condensing on the surface of metal powder in the drying process. The degree of vacuum of the decompressed atmosphere is preferably not higher than 100 Pa, more preferably not higher than 10 Pa. The degree of vacuum of the decompressed atmosphere is set in accordance with the volatility of organic solvent in the metal paste.

In the present invention, sintering must be performed after the metal paste has been applied and dried. Thereby, a proximity state of point contact is formed among the metal particles in the paste and between the bonded surface (paste-applied surface) of bonded member and the metal particle, and the metal paste is formed into a metal powder sintered compact. This metal powder sintered compact is subjected to plastic deformation in the contact portion thereof by being heated and pressurized at the later-described bonding time, and also combination of metal atoms is produced at the deformed interface, so that the sintered compact becomes a dense bonded portion. Even if the paste is pressurized without being sintered, the spacing of particles widens and therefore the combination of particles is not produced, so that bonding cannot be performed.

The temperature of sintering is set at 80 to 300° C. If the temperature is lower than 80° C., the above-described point contact is not produced. On the other hand, if sintering is performed at a temperature exceeding 300° C., sintering progresses excessively, and necking among metal powders progresses, so that firm combination occurs. Even if pressurization is performed subsequently, the dense bonded portion is not obtained, and additionally, distortion remains easily at the time of pressurization. Also, the reason why sintering is performed at a temperature not higher than 300° C. is that originally, the present invention aims at bonding at a temperature not higher than 300° C. to protect the bonded member. The heating time in sintering is preferably set at 30 to 120 minutes. If the time is insufficiently short, the temperature of a sintering furnace does not stabilize. If the time is too long, the productivity decreases. Also, sintering is preferably performed in the state of no load of pressure.

In the bonding method in which pressurization is accomplished after sintering, pressurization is accomplished by lapping the bonded member to which the metal paste is applied on the other bonded member. The pressure for pressurization is preferably higher than the yield strength of the metal powder sintered compact to obtain a dense bonded portion. Also, the pressure may be applied from one direction of either of the bonded members or from both directions.

In the bonding step, the metal powder sintered compact must be pressurized while being heated. If the metal powder sintered compact is not heated, the densification of bonded portion is insufficient, so that the bonding strength falls short. The heating temperature at this time is preferably 80 to 300° C. If the heating temperature is lower than 80° C., bonding cannot be performed. If the heating temperature is higher than 300° C., the thermal distortion at the cooling time exerts a great influence.

Also, in the bonding step, ultrasonic waves are preferably applied in addition to heating. Heating or a combination of heating and application of ultrasonic waves promotes the plastic deformation and combination of metal particles, by which a firmer bonded portion can be formed. In the case where ultrasonic waves are applied, the conditions are preferably such that the amplitude is 0.5 to 5 µm and the application time is 0.5 to 3 seconds. The reason is that an excessive application of ultrasonic waves damages the bonded member.

The heating and application of ultrasonic waves in the bonding step have only to be carried out at least on the metal powder sintered compact for the purpose thereof but may be carried out on the whole of the bonded member. As the heating method, a method in which heat transferred from a tool for pressurizing the bonded member is utilized is easy. Likewise, as a method for applying ultrasonic waves, a method in which ultrasonic waves are emitted from the tool for pressurizing the bonded member is easy.

BEST MODE FOR CARRYING OUT THE INVENTION

Figure 1:
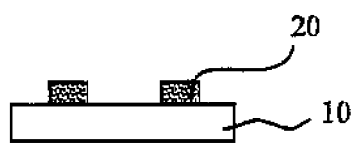
FIG. 1 is a schematic view for explaining the outline of a bonding step in accordance with an embodiment of the present invention.
Figure 1:
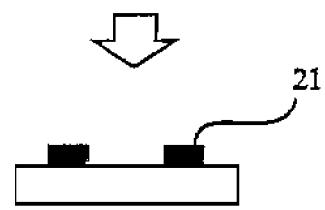
Figure 1:
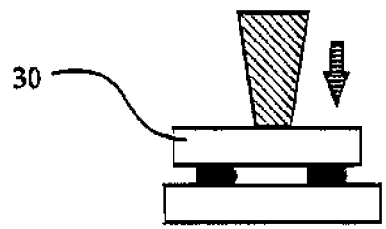
Figure 1:
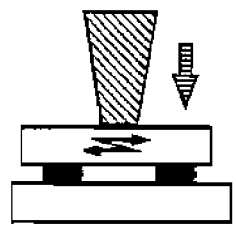
Figure 1:
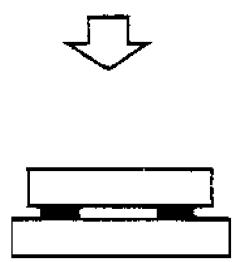

A preferred embodiment of the present invention is described hereunder. FIG. 1 is a schematic view showing an outline of a bonding step in which a semiconductor chip (GaAs chip) is bonded to a substrate, which was performed in this embodiment. Hereunder, the bonding steps in examples are described with reference to the drawings.

EXAMPLE 1

First, a metal paste 20 was applied to a semiconductor chip 10. The top surface of the semiconductor chip 10 was plated in advance with Ti (0.5 µm), Ni (1 µm), Au (1 µm) and Pd (1 µm). The metal paste used was prepared by mixing gold powder (an average particle diameter: 0.3 µm) having a purity of 99.99 wt % manufactured through the wet reduction method with an organic solvent of ester alcohol (2,2,4-trimethyl-3-hydroxypentaisobutylate ($C_{12}H_{24}O_3$)). The metal paste was applied to 100 locations on the chip in an area of 0.0034 mm² for each location.

The metal paste 20 was dried in a vacuum at a temperature of −10° C. in a dryer after being applied. Then, the chip was heated at a temperature of 230° C. for 30 minutes in an electric furnace to sinter the metal paste, by which a metal powder sintered compact 21 was formed.

After the sintering treatment, a nickel plate 30 (plated in advance with Au (1 µm) and Pd (1 µm)) was placed on the semiconductor chip 10, and the nickel plate 30 was bonded to the semiconductor chip 10 by heating and pressurization. The pressurization condition at this time was 0.2 N per sintered compact. Also, the heating temperature was set at 230° C. by the heat transfer from a tool. The heating and pressurization time in this bonding step was 10 minutes.

EXAMPLE 2

In example 2, the bonding was performed by applying ultrasonic waves simultaneously with the pressurization and heating of sintered compact. As in the case of example 1, after the metal paste had been applied to the semiconductor chip, dried, and sintered, the nickel plate was placed on the semiconductor chip, and heating and pressurization were accomplished as in the case of Example 1 (the pressure of pressurization was 0.33 N per sintered compact). The ultrasonic waves were applied by using a tool, and the application conditions were such that the amplitude was 3.2 μm, the output was 3.5 W, and the application time was 1 second.

Figure 2:
FIG. 2 is micrographs obtained as the result of structure observation of a metal powder sintered compact after being sintered and a bonded portion after being bonded.
Figure 2:
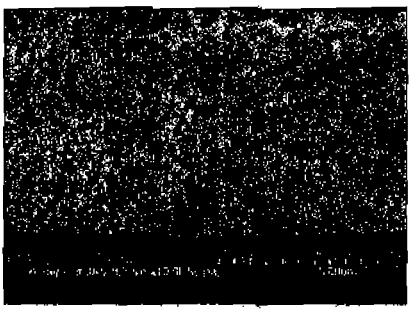
Figure 2:
Figure 2:
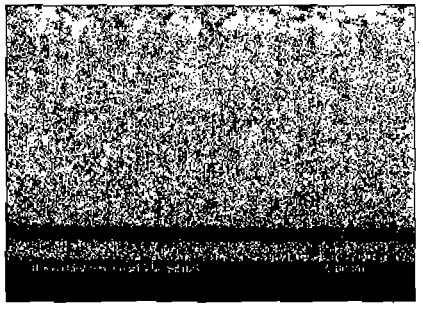
Figure 2:
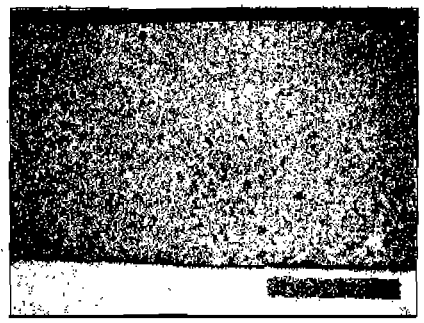
Figure 2:
Figure 3:
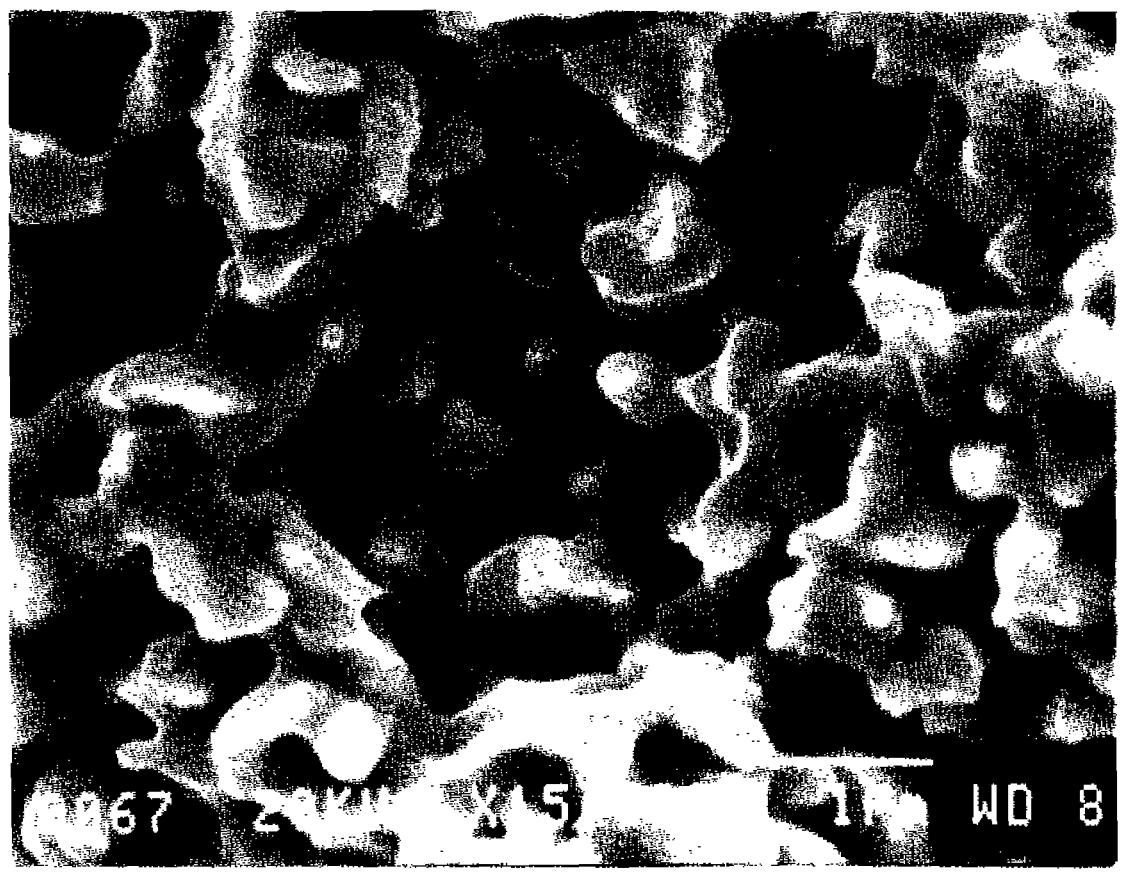
FIG. 3 is a micrograph showing the structure of a metal powder sintered compact at the time when sintering was performed at a temperature of 400° C.

The observation results of structures of the metal powder sintered compact after being sintered and bonded portions after being bonded in the above-described examples are shown in FIG. 2. As seen from FIG. 2, the metal powders are located close to each other in a state close to point contact by sintering. Due to the subsequent pressurization and heating, a dense structure is exhibited. In particular, it is found that the interior exhibits a fine crystalline composition by applying ultrasonic waves. As a preliminary test in this embodiment, the structure of metal powder sintered compact at the time when sintering is performed at a temperature of 400° C. is shown in FIG. 3. It is found that the sintering temperature of 400° C. promotes the combination of metal particles. Pressurization was accomplished in this state, and resultantly bonding could not be performed. That is to say, it is necessary to properly perform sintering before bonding.

Figure 4:
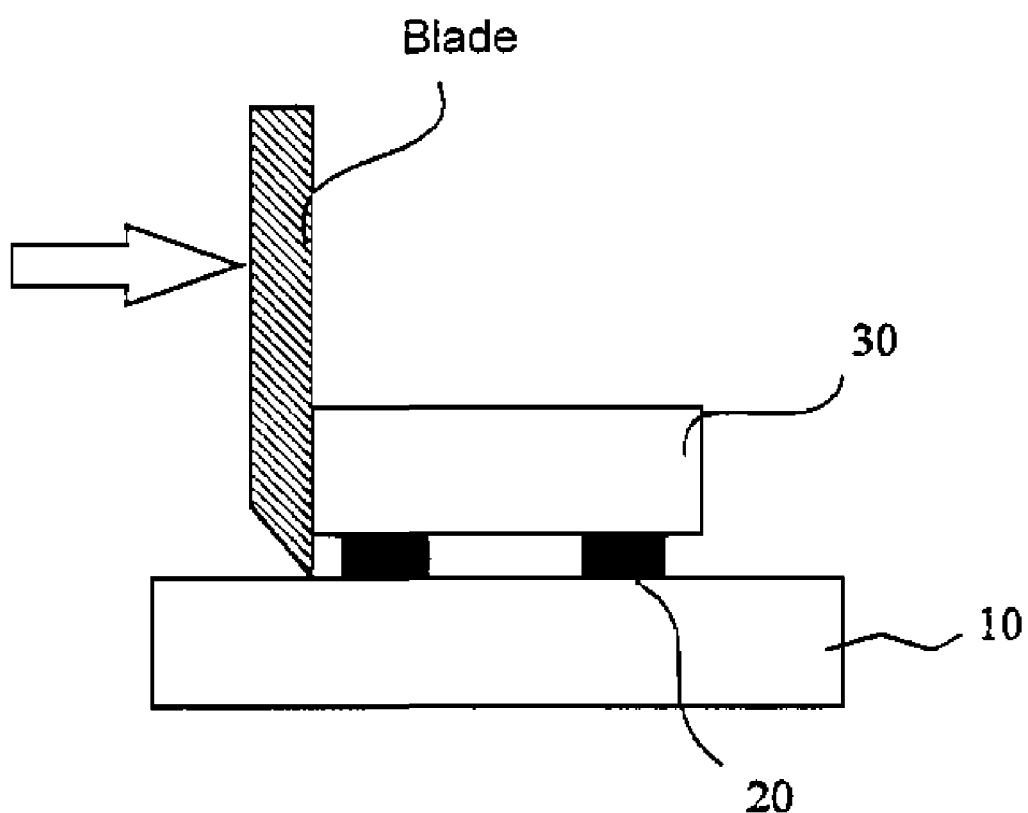
FIG. 4 is a schematic view showing a method for testing bonding strength.

Next, a study was conducted on the bonding strength regarding the bonding performed in the examples. In this study, as shown in FIG. 4, a blade was brought into contact with the chip from the transverse direction and was advanced at a fixed speed, and the stress at the time when rupture (separation of chip) occurred was measured. From this measured value and the bonded portion area after rupture, the strength per unit area was calculated. The result is given in Table 1.

TABLE 1

|  | Rupture stress per one bonded portion (mean value) | Bonding strength (mean value) |
|---|---|---|
| Example 1 (pressurization + heating) | 0.38 N | 104 MPa |
| Example 2 (pressurization + heating + ultrasonic waves) | 0.67 N | 126 MPa |

Table 1 reveals that both of the bonding strengths in the examples exceed 100 MPa. Considering the bonding of electronic parts etc., it can be said that these bonding strengths are sufficient. It is also found that the bonding strength is improved by the simultaneous use of ultrasonic waves at the time of bonding.

INDUSTRIAL APPLICABILITY

As described above, according to the present invention, various bonded members can be bonded at a relatively low temperature, and the bonded member can be protected from thermal stress in the cooling process after bonding. The present invention is useful when a semiconductor chip or the like that may be affected by thermal stress is bonded to a substrate, and can be applied to die bonding and flip chip bonding of the semiconductor chip. In the application to the flip chip bonding, the present invention can be applied to the formation of a bump of semiconductor chip.

The invention claimed is:

1. A method for bonding a pair of bonded members, comprising:
(a) a step of applying a metal paste to one bonded member, the metal paste consisting of one or more of gold powder, silver powder, platinum powder, and palladium powder having a purity not lower than 99.9 percent by weight and an average particle diameter of 0.3 μm to 1.0 μm and an organic solvent;
(b) a step of drying the metal paste at a temperature of −20° C. to 5° C. in a decompressed vacuum atmosphere having a degree of vacuum not higher than 100 Pa, and sintering the dried metal paste at a temperature of 80 to 300° C. to form a metal powder sintered compact; and
(c) a step of contacting the one bonded member and another bonded member together via the metal powder sintered compact between the bonded members and bonding the bonded members to each other by applying pressure from one direction of either the bonded members or both directions while at least the metal powder sintered compact is heated.

2. The bonding method according to claim 1, wherein the heating temperature in step (c) is 80 to 300° C.

3. The bonding method according to claim 1, wherein ultrasonic waves are further applied at least to the metal powder sintered compact for pressuring it in step (c).

4. The bonding method according to claim 2, wherein ultrasonic waves are further applied at least to the metal powder sintered compact for pressuring it in step (c).

5. The bonding method according to claim 1 wherein the organic solvent comprises one or more of an ester alcohol, turpinol, pine oil, butyl carbitol acetate, butyl carbitol, carbitol.

6. The bonding method according to claim 5 wherein the ester alcohol, if present, comprises 2,2,4,-trimethyl-3-hydroxypentaisobutylate.

7. The bonding method according to claim 1 wherein the metal paste is applied to the one bonded member by spin coating, screen printing, ink jet, spreading, or dipping.

8. The bonding method according to claim 1 wherein step (b) is conducted in a decompressed vacuum atmosphere.

9. The bonding method according to claim 8 wherein step (b) is conducted in a decompressed vacuum atmosphere having a degree of vacuum not higher than 100 Pa.

10. The bonding method according to claim 8 wherein step (b) is conducted in a decompressed vacuum atmosphere having a degree of vacuum not higher than 10 Pa.

11. The bonding method according to claim 1 wherein step (b) is conducted by preventing moisture from condensing on a surface of the metal powder.

12. The bonding method according to claim 1 wherein in step (c) the metal powder sintered compact is subjected to plastic deformation.

13. The bonding method according to claim 1 wherein the heating time in step (c) is from 30 to 120 minutes.

14. The bonding method according to claim 1 wherein the sintering in step (b) is performed with no load of pressure.

15. The bonding method according to claim 1 wherein pressurization is performed after sintering.

16. The bonding method according to claim 15 wherein pressurization is at a pressure higher than the yield strength of the metal powder sintered compact.

17. The bonding method according to claim 3 wherein the ultrasonic waves have an amplitude of 0.5 to 5 μm and the ultrasonic waves are applied for 0.5 to 3 seconds.

18. The bonding method according to claim 1 in which the one bonded member is a semiconductor ship and the another bonded member is a nickel plate.

* * * * *